United States Patent [19]
Kleine

[11] Patent Number: 5,781,052
[45] Date of Patent: Jul. 14, 1998

[54] STATIC LATCHES WITH ONE-PHASE CONTROL SIGNAL

[75] Inventor: Ulrich Kleine, Helmstedt, Germany

[73] Assignee: Siemens Aktiengesellschaft, Munich, Germany

[21] Appl. No.: 784,950

[22] Filed: Jan. 16, 1997

[30] Foreign Application Priority Data

Jan. 16, 1996 [DE] Germany ............... 196 01 370.4

[51] Int. Cl.$^6$ .................. H03K 3/356; H03K 19/20
[52] U.S. Cl. .................. 327/208; 327/210; 327/211; 327/212; 327/218
[58] Field of Search .................. 327/199–201, 327/208–212, 215–218, 221, 225; 326/104, 106–108

[56] References Cited

U.S. PATENT DOCUMENTS

| | | | |
|---|---|---|---|
| 4,461,964 | 7/1984 | Shiotari | 327/88 |
| 4,868,511 | 9/1989 | Des Brisay, Jr. | 327/225 |
| 5,373,200 | 12/1994 | Hasegawa et al. | 327/218 |

FOREIGN PATENT DOCUMENTS

| | | | |
|---|---|---|---|
| 2-274119 | 11/1990 | Japan | 327/217 |
| 4-33407 | 2/1992 | Japan | 327/225 |

OTHER PUBLICATIONS

Chapter 5 CMOS Circuit and Logic Design–pp. 214–216.

*Primary Examiner*—Timothy P. Callahan
*Assistant Examiner*—T. T. Lam
*Attorney, Agent, or Firm*—Hill & Simpson

[57] ABSTRACT

A status latch with one-phase control signal is constructed only from purely static gates, thus has great security against interference in the stationary state, and is thus suited in particular for low-voltage operation. In the one-phase latch, the power loss is particularly low due to the lower wiring capacity of the control lines, for which reason it can be advantageously used in particular in digital circuits with high data rates. Advantageously, a low number of transistors is required.

4 Claims, 3 Drawing Sheets

STATIC LATCHES WITH ONE-PHASE CONTROL SIGNAL

BACKGROUND OF THE INVENTION

By a latch is meant here a digital circuit with a data input, a data output and one or several control inputs. If the control inputs are activated, the data word present at the input appears non-inverted, or is inverted at the data output. In this operating state, the circuit of the latch is transparent. In the case of inactive control lines, the state of the last transparent phase is maintained at the output, and the circuit is not transparent in this operating state. In relation to two-phase and multiple-phase latches, one-phase latches have the advantage that what are known as glitches do not occur, given sufficient steepness of the control signal. Glitches are malfunctions in latches, whereby data words do not "slip through" the latch in the non-transparent operating mode, due for example to an insufficiently steep control signal, or, in multiple-phase latches, due to different run times of the individual control signals (clock skew). A further advantage of the one-phase latches is the lower capacity of the control signal lines, and thereby also the lower power loss caused by the reloading of the control signal lines. One-phase latches are used in particular in digital circuits with high data rates.

From the article N. Weste and K. Eshraghian, with the title "Principles of CMOS VLSI Design. A System Perspective," Addison-Wesley, 1985, pp. 214 to 216, a static one-phase latch is known, which however is disadvantageously constructed from relatively complex gates or relatively many transistors.

SUMMARY OF THE INVENTION

An object of the invention is to indicate a static latch in which only a single takeover signal or control signal is required for driving, it is constructed with pure static gates and it has as few transistors as possible.

According to the invention, a static latch is provided having an AND NOR gate and a NOR gate. A first AND input of the ANDNOR gate is connected with an input of the latch. A second AND input of the ANDNOR gate is connected with a control signal input. An output of the AND-NOR gate forms an output of the latch and is connected with a first input of the NOR gate. A second input of the NOR gate is connected with the control signal input. An output of the NOR gate is connected with a NOR input of the ANDNOR gate.

DESCRIPTION OF THE PREFERRED EMBODIMENTS

Figure 1:
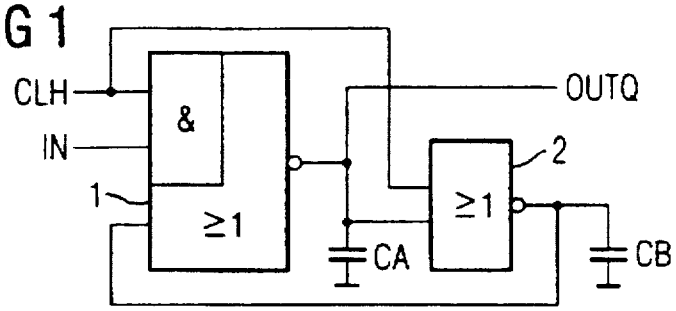
FIGS. 1 to 4 are logic diagrams for different constructions of the latch of the invention.

FIG. 1 shows the logic diagram of the latch in the construction of a high-active inverting latch, comprising an ANDNOR gate 1 and a NOR gate 2. A first AND input of gate 1 is connected with an input IN of the latch, and a second AND input is connected with a control signal CLH, which at the same time is also supplied to a first input of the NOR circuit 2. The output of the ANDNOR gate 1 represents at the same time a negated output of the latch with an output signal OUTQ, which has a node capacity CA in relation to ground, and which is connected with a second input of the NOR gate 2. An output of the NOR gate 2 has a node capacity CB in relation to ground and is connected with a NOR input of the AND-NOR gate 1.

If the control signal CLH is at a logical high, the output of the NOR gate 2 is logically low. The output of the ANDNOR gate thus determines the logical level of the output signal OUTQ, since the second NOR input of the ANDNOR gate 1 is logically low. The AND gating of the input signal IN and of the control signal CLH, and the subsequent OR-gating with negation, brings it about that the inverted input signal IN appears at the output. In this operating state, the latch is transparent and inverted. If the control signal is at logical low, the circuit works as a flip-flop. The output of the ANDNOR gate 1 is determined solely by the level at the output of the NOR gate, since the AND output is at logical low. During the switchover from the transparent to the non-transparent phase, a logical low level is present at both NOR inputs of the ANDNOR gate. This leads to a high level at the output of the ANDNOR gate and, if warranted, to the overwriting of the output level OUTQ. So that the flip-flop stores correctly and the above-described glitches do not occur, the circuit is to be dimensioned in such a way that the gate run time of the NOR gate is shorter than that of the ANDNOR gate. This condition is however fulfilled in every case, since the ANDNOR gate is more complex than the NOR gate and the node capacity CA is in every case larger than the node capacity CB, due to the larger number of connected elements.

Figure 2:
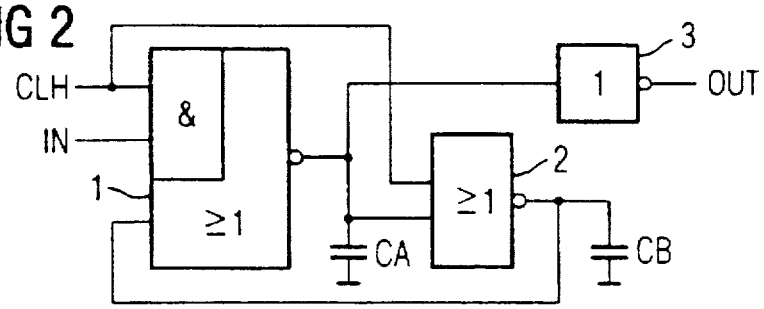

FIG. 2 shows the logic diagram of a high-active non-inverting latch. The additional inverting takes place through the subsequent connection of an inverter 3 to the output of the latch shown in FIG. 1. The additional inverter can however also be used for driver matching.

Figure 3:
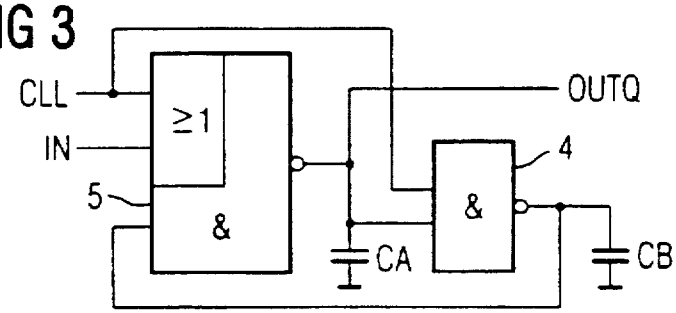

FIG. 3 shows a latch of the invention in the construction of a low-active inverting latch, which is distinguished from the latch shown in FIG. 1 only in that in place of the ANDNOR gate 1 an ORNAND gate 5 is provided, and in place of the NOR gate 2 a NAND gate 4 is provided. Also, the control signal is designated CLL instead of CLH. If the control signal (CLL) is at a logical low, the output of the NAND gate is logically high. Thus, the second NAND input of the ORNAND gate is logically high, and the OR output of the ORNAND gate determines the logical level of the output signal OUTQ. Since the control signal CLL is logically low, the output level is determined solely by the input signal IN. In this operating state, the latch is transparent and inverts the input signal IN. If the control signal is at a logical high, the circuit again works statically as a flip-flop. The output of the NAND gate is again determined by the output signal OUTQ, since the control signal CLL is logically high, and the logical level at the output of the ORNAND gate is determined solely by the level at the output of the NAND gate. To ensure a correct switchover from the transparent to the non-transparent phase, it is again necessary that the second gate, i.e. the NAND gate, switches faster than the ORNAND gate. Given a standard dimensioning of the gates, this is already fulfilled due to the greater complexity of the ORNAND gate and the greater node capacity at the output of the ORNAND gate.

Figure 4:
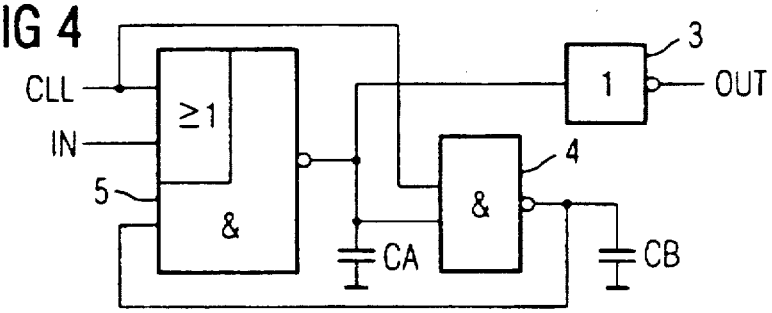

FIG. 4 shows a logic diagram of the latch of the invention in the embodiment of a low-active, non-inverting latch, which is distinguished from the latch shown in FIG. 3 only by an additional inverter at the output of the latch, which can also be used for driver matching.

The expressions "high-active" and "low-active" relate to the transparent phase of the latch. High-active latches are transparent, given logical high levels on the control lines.

Figure 5:
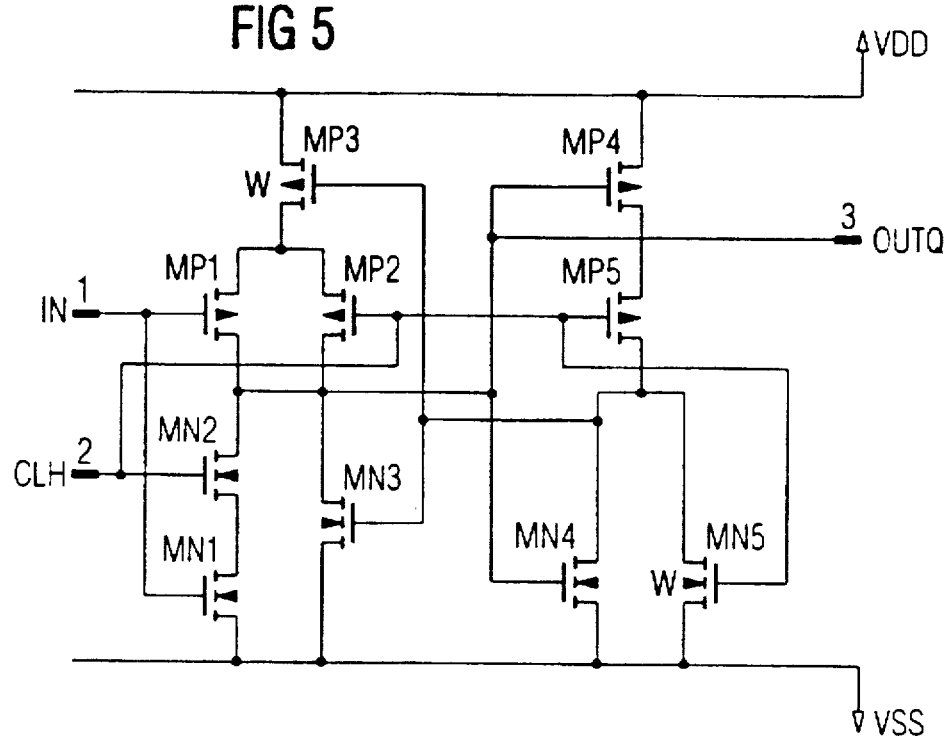
FIGS. 5 to 8 are schematic diagrams for the logic diagrams of FIGS. 1, respectively to 4.

FIG. 5 shows a CMOS circuit of the logic diagram of FIG. 1 at the transistor level, whereby the ANDNOR circuit 1 comprises n-channel MOS transistors MN1 ... MN3 and p-channel MOS transistors MP1 ... MP3, and the NOR gate 2 comprises n-channel MOS transistors MN4 and MN5 as well as p-channel MOS transistors MP4 and MP5. The two transistors MP1 and MP2 are thereby connected in parallel, and are connected with the supply voltage VDD via the transistor MP3. The two transistors MN1 and MN2 are connected in series, and a connection node of the two transistors MP1 and MP2, which node is not connected with the transistor MP3 and which guides the output signal OUTQ, is connected with reference potential VSS both via the series circuit of the transistors MN1 and MN2 and also via the transistor MN3. The gates of the two transistors MP1 and MN1 are thereby connected with the input signal IN of the latch, and the gates of the transistors MP2 and MN2 are connected with the control signal CLH. The two gates of the transistors MP3 and MN3 are connected with one another, and represent the NOR input of the ANDNOR circuit 1, which is connected with the output node of the NOR circuit 2. The transistors MP4 and MP5 are connected in series, and the transistors MN4 and MN5 are connected in parallel, whereby the connection node between the transistors MN4 and MN5 forms the output of the NOR gate 2, one terminal of the transistor MP4 is connected with the supply voltage VDD, and a terminal of the transistors MN4 and MN5 is connected with reference potential VSS. The gates of the transistors MP4 and MN4 are connected with the output signal OUTQ, and the gates of the transistors MP5 and MN5 are connected with the control signal CLH.

In order to further reduce the above-described malfunctions (glitches) in the latches, for example the gate width W of the transistors MP3 and MN5 can be chosen smaller than in the remaining transistors of the latch.

Figure 6:
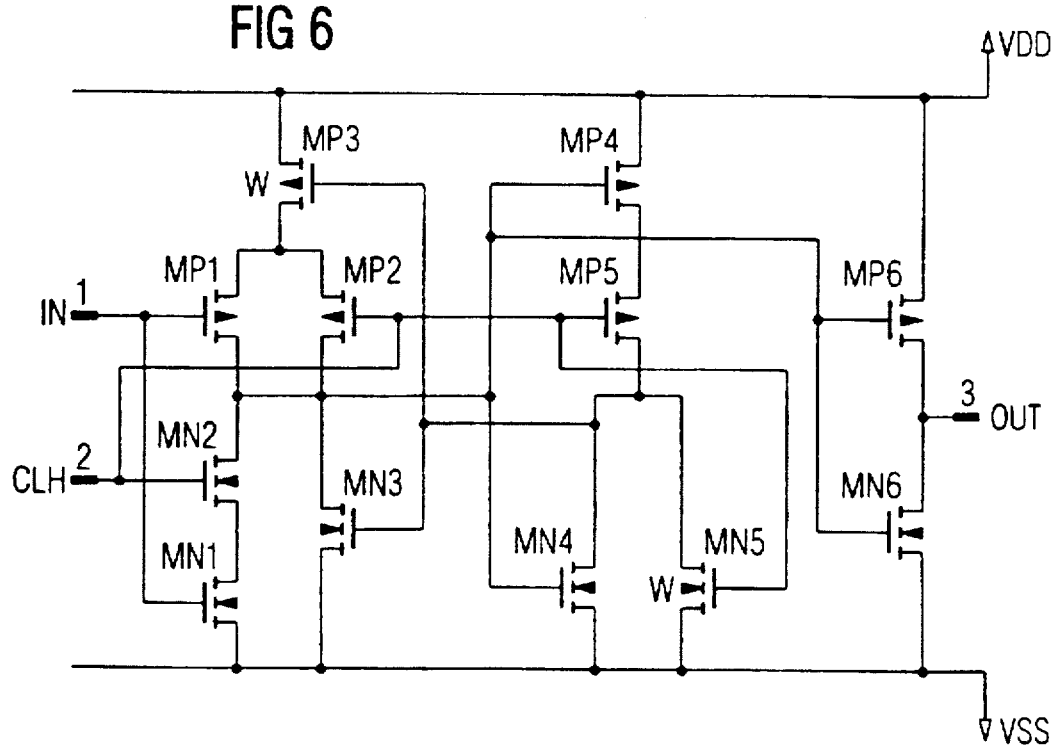

The schematic diagram shown in FIG. 6 corresponds to the logic diagram shown in FIG. 2, and is distinguished from the latch shown in FIG. 5 only by the inverter subsequently connected at the output, which inverter here is formed of a series circuit of an n-channel MOS transistor MN6 and of a p-channel MOS transistor MP6, whereby the output with the signal OUT is connected with the supply voltage VDD via the transistor MP6, and is connected with reference potential via the transistor MN6.

Figure 7:
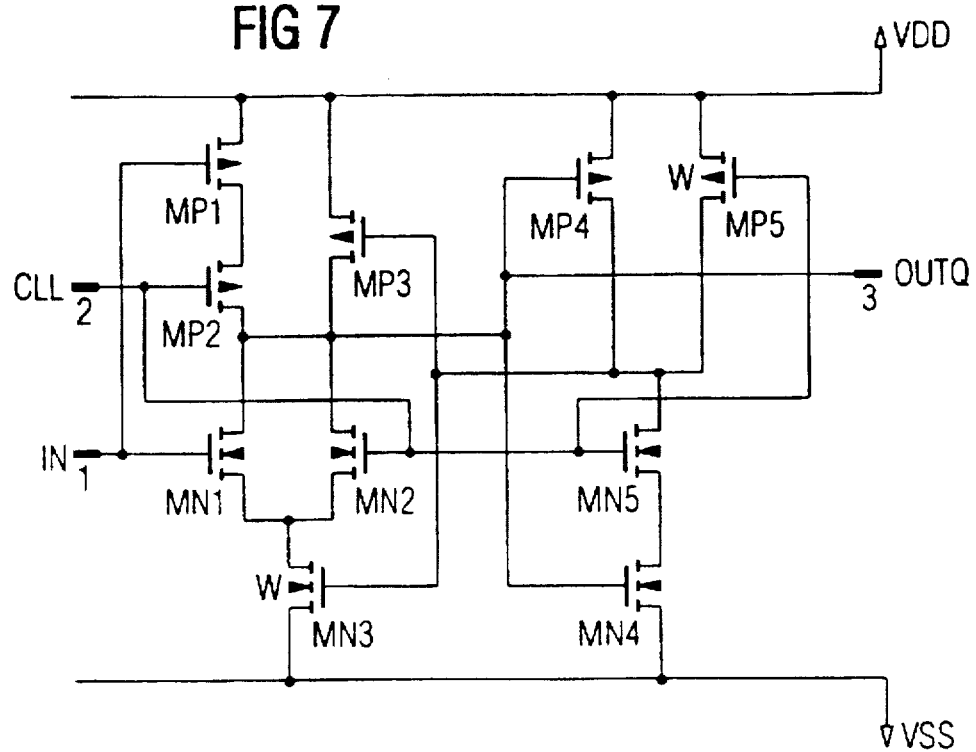

FIG. 7 shows a circuit that corresponds to the logic diagram of FIG. 3, whereby the ORNAND circuit 5 in turn comprises n-channel transistors MN1 ... MN3 and p-channel transistors MP1 ... MP3 and the NAND circuit 4 comprises n-channel transistors MN4 and MN5 as well as p-channel transistors MP4 and MP5. The transistors MN1 and MN2 are connected in parallel, and a first node of the parallel circuit is connected with reference potential VSS via the transistor MN3. A further connection node of the parallel circuit of the two transistors MN1 and MN2 represents the output with the signal OUTQ, and is connected with the supply voltage VDD via, on the one hand, a series circuit of the transistors MP1 and MP2, and via, on the other hand, the transistor MP3. The gates of the transistors MP1 and MN1 are connected with the input signal IN of the latch, and the gates of the transistors MN2 and MP2 are connected with the control signal CLL. The gates of the transistors MN3 and MP3 are commonly connected with the output node of the NAND circuit 4. The output node of the NAND circuit 4 is connected with reference potential via a series circuit of the transistors MN4 and MN5, and is connected with supply voltage VDD via a parallel circuit of the transistors MP4 and MP5. The gates of the transistors MP4 and MN4 are connected with the output signal OUTQ, and the gates of the transistors MN5 and MP5 are connected with the control signal CLL.

A further possibility for the reduction of the malfunction of the latch here likewise involves selecting the channel width W of the transistors MN3 and MP5 smaller than the channel widths of the remaining transistors.

Figure 8:
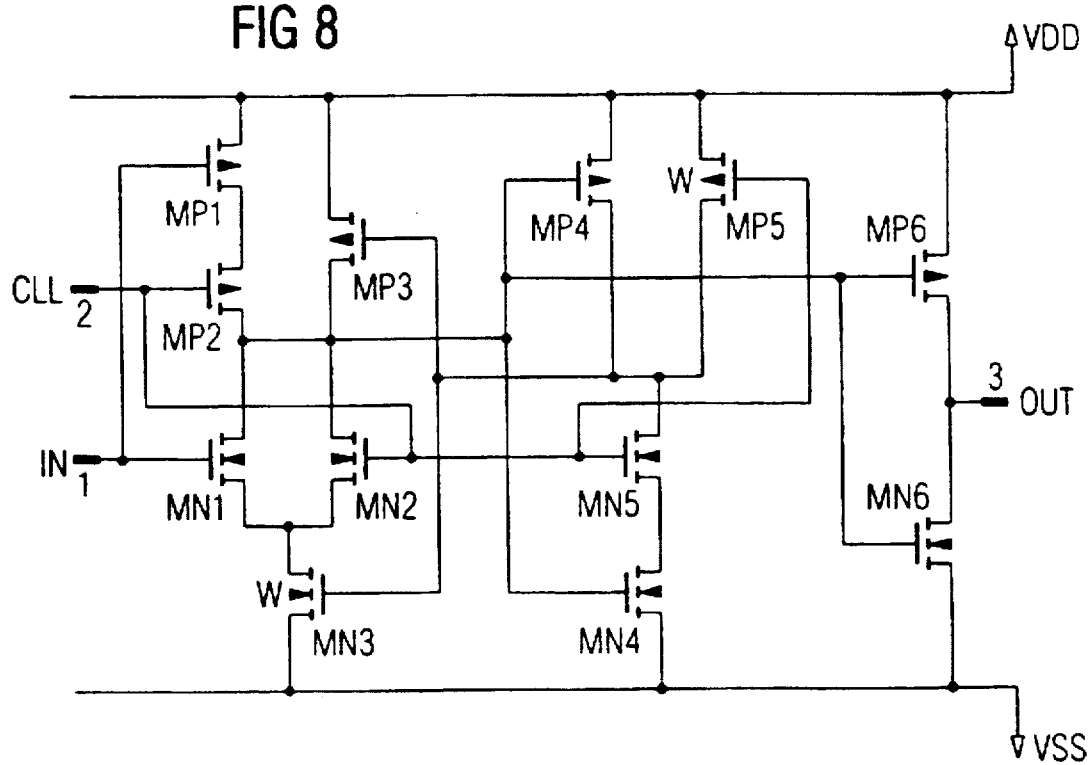

FIG. 8 shows a circuit diagram of the logic diagram of FIG. 4, in which in relation to the logic diagram of FIG. 3 an additional inverter 3 is provided, which in FIG. 8 is formed in turn of a series circuit of transistors MN6 and MP6, whereby the output OUT is connected with supply voltage VDD via the transistor MP6 and is connected with the reference potential VSS via the transistor MN6.

Although various minor changes and modifications might be proposed by those skilled in the art, it will be understood that my wish is to include within the claims of the patent warranted hereon all such changes and modifications as reasonably come within my contribution to the art.

I claim as my invention:

1. A static latch, comprising:

an ANDNOR gate and a NOR gate;

a first AND input of the ANDNOR gate being connected with an input of the latch, and a further AND input of the ANDNOR gate being connected with a control signal input;

an output of the ANDNOR gate forming an output of the latch and being connected with a first input of the NOR gate;

a second input of the NOR gate being connected with the control signal input;

an output of the NOR gate being connected with a NOR input of the ANDNOR gate;

the ANDNOR gate comprising a first, a second and a third n-channel MOS field-effect transistor, as well as a first, a second and a third p-channel MOS transistor;

the output of the latch being connected with a supply voltage via a series circuit of the first and third p-channel MOS transistors, as well as via a series circuit of the second and third p-channel MOS transistors, and the output being connected with reference potential via a series circuit of the first and second n-channel MOS transistors, as well as via the third n-channel MOS transistor;

gates of the first n-channel and first p-channel transistors being connected with the input of the latch, gates of the second p-channel and n-channel MOS transistors being connected with the control signal input, and gates of the third p-channel and third n-channel MOS transistor being connected with the output of the NOR gate;

the NOR gate comprising fourth and fifth n-channel MOS transistors as well as fourth and fifth p-channel MOS transistors;

the output of the NOR gate being connected with the supply voltage via a series circuit of the fourth and fifth p-channel MOS transistors and being connected with the reference potential via a parallel circuit of the fourth and fifth n-channel MOS transistors;

gates of the fourth n-channel MOS transistor and fourth p-channel MOS transistor being connected with the output of the latch; and a gate of the fifth n-channel MOS transistor and a gate of the fifth p-channel MOS transistor being connected with the control signal input.

2. The latch according to claim 1, wherein an inverter is connected after the output of the ANDNOR gate for formation of a non-inverted output.

3. A static latch, comprising:

an ORNAND gate and a NAND gate, a first OR input of the ORNAND gate being connected with an input of the latch and a further OR input of the ORNAND gate being connected with a control signal input;

an output of the ORNAND gate forming the output of the latch and also being connected with a first input of the NAND gate;

a second input of the NAND gate being connected with the control signal input;

an output of the NAND gate being connected with a NAND input of the ORNAND gate;

the ORNAND gate comprising first, second and third n-channel MOS field-effect transistors as well as first, second and third p-channel MOS transistors;

the output of the latch being connected with a supply voltage via a series circuit of the first and second p-channel MOS transistors, as well as via a third p-channel MOS transistor, and is connected with reference potential via a series circuit of the first and third n-channel MOS transistors, as well as via the second and third n-channel MOS transistors;

gates of the first n-channel and first p-channel transistors being connected with the input of the latch, gates of the second p-channel and second n-channel MOS transistors being connected with the control signal input, and gates of the third p-channel and third n-channel MOS transistors being connected with the output of the NAND gate;

the NAND gate comprising fourth and fifth n-channel MOS transistors, as well as fourth and fifth p-channel MOS transistors;

the output of the NAND gate being connected with the supply voltage via a parallel circuit of the fourth and fifth p-channel MOS transistors and being connected with the reference potential via a series circuit of the fourth and fifth n-channel MOS transistors;

gates of the fourth n-channel MOS transistor and of the fourth p-channel MOS transistor being connected with the output of the latch; and a gate of the fifth n-channel MOS transistor and a gate of the fifth p-channel MOS transistor being connected with the control signal input.

4. The latch according to claim 3 wherein an input of an inverter is connected after the output of the ORNAND gate for formation of a non-inverted output at an output of the inverter.

* * * * *